United States Patent [19]

Bruder

[11] Patent Number: 4,559,616
[45] Date of Patent: Dec. 17, 1985

[54] FAST, NON-VOLATILE SEMICONDUCTOR/BUBBLE MEMORY WITH TEMPERATURE-COMPENSATED MAGNETIC BIAS FIELD

[75] Inventor: John F. Bruder, Phoenix, Ariz.
[73] Assignee: Quadri Corporation, Tempe, Ariz.
[21] Appl. No.: 657,194
[22] Filed: Oct. 3, 1984
[51] Int. Cl.⁴ .............................................. G11C 19/08
[52] U.S. Cl. ...................................................... 365/28
[58] Field of Search ................................ 365/1, 27, 28

[56] References Cited

U.S. PATENT DOCUMENTS 4,117,544  9/1978  Ault ........................................ 365/28

Primary Examiner—James W. Moffitt
Attorney, Agent, or Firm—Cahill, Sutton & Thomas

[57] ABSTRACT

A system for optimizing the performance of a bubble memory includes a temperature sensor, the output of which is amplified and converted to a digital number by a low power A/D converter to address a memory that stores correction data for various temperatures represented by the temperature sensor output. The correction data output by the memory is converted to an analog signal that is used to control the current flowing through a bias coil of the bubble memory. The bubble memory is used as a non-volatile back-up memory for a CMOS-RAM. A relatively small capacitor bank is charged to a high voltage during normal operation of the CMOS-RAM by a voltage booster circuit. In the event of a power interruption, low power control circuitry actuates a voltage down converter circuit that produces a regulated output voltage to temporarily power the control circuitry while the CMOS-RAM is being transferred to the bubble memory. The temperature correction of the magnetic bias field makes possible optimized performance of the bubble memory with low power consumption, allowing the physical size of the capacitor bank to be minimized so that the entire hybrid memory system, including the capacitor bank, can be implemented as a plug-in replacement for a pre-existing core memory module.

11 Claims, 6 Drawing Figures

FAST, NON-VOLATILE SEMICONDUCTOR/BUBBLE MEMORY WITH TEMPERATURE-COMPENSATED MAGNETIC BIAS FIELD

BACKGROUND OF THE INVENTION

The invention relates to computer memories, and more particularly to non-volatile computer memories of the type which retain their stored data despite an interruption in power that supplies the memory, and still more particularly to non-volatile memories other than core memories.

Although in earlier years the dominant technology for mainframe memories was the ferrite core memory technology, for most applications lower cost, higher speed, lower power semiconductor memories have replaced the ferrite core memory technology. However, semiconductor memories have always suffered from one drawback compared to core memories in that semiconductor memories are generally volatile. That is, semiconductor memories (of the type that are presently practical for use in computer mainframe memories) lose stored data if the power supplying the computer is interrupted, even momentarily. Various techniques have been devised for overcoming this problem in most commercial computer systems, for example, by providing various battery back up systems. However, in some applications, especially in certain military applications, core memories remain the dominant technology, and the main reason for this is that non-volatility is needed. However, the continued development and refinement and lower costs of various semiconductor technologies would make it increasingly attractive to be able to utilize semiconductor memories in applications still dominated by the ferrite core technology, if there were a practical way of overcoming the volatility of semiconductor main memory technology.

Accordingly, it is clear that there remains an unmet need for a practical, inexpensive, non-volatile, high speed, lower power semiconductor memory replacement for certain ferrite core memory applications.

SUMMARY OF THE INVENTION

Accordingly, it is an object of the invention to provide a non-volatile, low power, high speed semiconductor memory "plug-in replacement" for ferrite core random access memories.

It is another object of the invention to provide a non-volatile semiconductor memory which truly completely replaces a preexisting core memory module by simply unplugging the core memory module and plugging the semiconductor memory into the same slot.

It is another object of the invention to provide a system for optimizing the design of a bubble memory system over a predetermined temperature range.

Briefly described, and in accordance with one embodiment thereof, the invention provides a method and apparatus for operating a bubble memory system by storing digital temperature compensation data numbers, each representative of the amount of change of a magnetic bias field produced in the bubble memory system, needed to optimize the operation of the bubble memory system, each of the digital temperature compensation data numbers corresponding to a different temperature of the bubble memory system, by sensing a temperature indicative of the present temperature of a bubble memory chip to produce an analog temperature signal, by converting the analog temperature of the bubble memory chip, by accessing memory locations in which the digital temperature compensation data numbers are stored to obtain the temperature compensation data number corresponding to the present temperature, by converting that temperature compensation number to an analog output signal, and by changing the magnetic bias field by an amount corresponding to the value of the analog output signal. In the described embodiment of the invention, the memory in which the temperature compensation data numbers are stored is a programmable read only memory. The analog temperature signal is converted to a digital number by a low power CMOS analog to digital converter, and the compensation number produced by accessing the programmable read only memory is converted to an analog output correction signal by a low power CMOS digtal to analog converter.

In the described embodiment of the invention, an optional magnetic field sensor produces an analog output signal in response to the magnetic bias field which, in conjunction with the analog output correction signal of the digital to analog converter, is used to correct the drive current in a bias field coil that produces the magnetic bias field, thereby correcting for the variations in the bias field due, for example, to aging of components of the system. The bubble memory system and its temperature compensating apparatus and magnetic field compensating apparatus are included in a hybrid memory system that includes a high speed CMOS memory. The bubble memory functions as a non-voltatile back-up memory into which the contents of the CMOS memory are transferred in the event of a power interruption. In the event of a power interruption, temporary power is supplied to the CMOS memory and to the bubble memory system, and also to a low power control circuit by means of a high voltage capacitor bank which is gradually discharged into a down voltage converter that produces a constant, regulated output voltage to the control circuitry, the CMOS memory, and the bubble memory system. During normal memory operation, a conventional power bus supplies operating power to the control circuitry and to the CMOS memory, and also charges up the capacitor bank to a predetermined high voltage. The correction of the magnetic bias field for variations in temperature of the bubble memory chip makes possible the optimized peformance of the bubble memory system with low power consumption, which in turn allows the physical size of the capacitor bank to be minimized, so that the entire hybrid memory system, including the capacitor bank, can be implemented as a plug-in replacement for a pre-existing core memory module.

BRIEF DESCRIPTION OF THE DRAWING

FIG. 3A is a perspective un-exploded view of the packaged bubble memory of FIG. 3.

DESCRIPTION OF THE INVENTION

Figure 1:
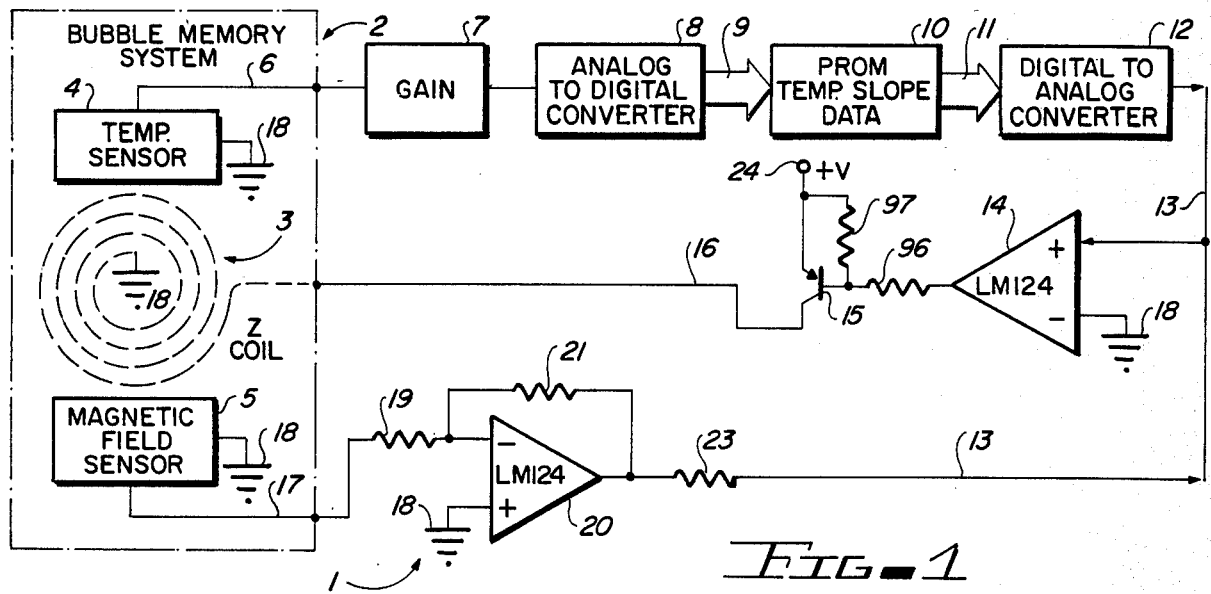
FIG. 1 is a block diagram of the temperature compensation system for the bias field produced by a Z coil of a bubble memory system to automatically compensate for variations in temperature of the bubble memory system.

Referring now to the drawings, a bias field compensated bubble memory module 1 includes a typical bubble memory module 2. The basic components of the bubble memory system 2, including a bubble memory chip, two permanent bias magnets, a conventional X coil, a Y coil, and a Z coil are subsequently described with reference to FIG. 3. These components are all quite conventional.

In the present invention, the current through the Z coil 3 is automatically varied to compensate the bias field produced by the two permanent magnets with respect to the temperature of bubble memory system 2. For convenience of illustration, the Z coil is designated by dotted lines 3 in bubble memory system 2, although the other conventional components are not indicated in FIG. 1.

A suitable temperature sensor 4 appropriately located near the bubble memory chip in bubble memory system 2 is connected between a ground conductor 18 and a conductor 6. Conductor 6 is connected to the input of a gain amplifier 7, the output of which is connected to the analog input of analog to digital converter 8. The details of analog to digital converter 8 are subsequently described with reference to FIG. 2.

At this point, it is worthwhile to emphasize that it is essential that the overall power dissipation of bias field compensated bubble memory module 1 be kept as low as possible, so that the energy storage capacitors 49 in the hybrid CMOS/bubble memory system of FIG. 4, subsequently described, can be as small as possible while still allowing a complete transfer of all data from the CMOS memory 41 to the bubble memory 42 in the event of a power failure. Preferably, the size of the entire hybrid CMOS/bubble memory system 40 of FIG. 4, including the storage capacitors 49 and all associated control circuitry, fits into a package having the dimensions of 6 inches by 9 inches by 1.4 inches.

In the described embodiment of the invention, analog to digital converter 8 is an eight bit device, and its eight digital output bits are designated by reference numeral 9. A digital output 9, including any necessary control lines, are connected to the address and other appropriate inputs of programmable read only memory (PROM) 10. The data outputs of programmable read only memory 10, are connected to the digital inputs of a low power digital to analog converter 12. The data stored in programable read only memory includes temperature compensation data corresponding to the correction in the magnetic field produced by Z coil 3 in order to optimize the operation of bubble memory system 2 at each of 256 different temperatures of the bubble memory chip, in the range from −55° to +85° Centigrade.

The analog output of digital to analog converter 12 is connected to conductor 13. Conductor 13 is connected to the positive input of an amplifier 14, the negative input of which is connected to ground conductor 18. The amplified analog signal on conductor 13 produced at the output of amplifier 14 is applied by means of a resistor 96 to the base of a PNP power transistor 15, which base is coupled by another resistor 97 to its emitter. The junction between the emitter and base of transistor 15 are connected to a volt supply voltage conductor 24. The collector of PNP transistor 15 is connected to conductor 16, which is connected to one terminal of Z coil 3, the other terminal of which is connected to the ground conductor 18.

Optionally, a magnetic field sensor 5, such as a Hall effect device, is connected between ground conductor 18 and a conductor 17. Conductor 17 is coupled by a resistor 19 to the negative input of an operational amplifier 20, the positive input of which is connected to ground conductor 18. The inverting input of operational amplifier 20 is connected by resistor 21 to the output thereof, so that the ratio of the resistors 19 and 21 determines the gain of amplifier 20. The output of amplifier 20 is coupled by resistor 23 to conductor 13.

The "basic" operation of the bubble memory system 2 is essentially as it would be without the bias field compensation system including the circuitry shown in FIG. 1. Note that the circuitry that drives the conventional X coil and Y coils to produce the well-known rotating vector which effectuates propagation of bubbles in the bubble memory chip is commonly used by those skilled in the art, and therefore is not described here.

It is known to those skilled in the art that the operation of the bubble memory chip is temperature sensitive, and that values of the bias field, (which is produced mainly by the two permanent magnets positioned above and below the bubble memory chip) are optimum at certain temperatures of the bubble memory chip. Accordingly, the temperature of the bubble memory chip is sensed by temperature sensing element 4 and amplified as necessary by gain circuit 7 to produce a suitable analog signal representative of the present temperature of the bubble memory chip. This analog signal is applied to the input of analog to digital converter 8. Analog to digital converter 8 converts this signal to an 8 bit digital word 9, which is a digital representation of the present bubble memory chip temperature. This eight bit word is used to address programmable read only memory 10.

Each of the 256 addresses of programmable read only memory 10 corresponds to a different temperature of the bubble memory chips. At each such address there is stored an eight bit data word that represents a correction that needs to be made to the current flowing through Z coil 3 in order to cause the magnetic bias field to which the bubble memory chip is subjected to have an optimum value.

In accordance with the present invention, the various values written into each of the 256 locations of programmable read only memory 10 are empirically determined by subjecting the bubble memory system 2 to each of 256 different temperatures, experimentally varying the magnetic bias field (by superimposing appropriate digital levels on conductors 11) until optimized bubble memory performance is achieved. The optimum digital number, when determined, then is written into programmable read only memory 10 at an address corresponding to that temperature.

Then, during normal operation, this digital temperature compensation number can be produced by PROM 10 to cause digital to analog converter 12 to produce an analog output signal on conductor 13, which, when amplified by amplifier 14, causes the necessary correction current to flow through Z coil 3 to thereby produce the optimum bias field at the present temperature.

It should be noted the above-described system can, if necessary, operate quite successfully without magnetic field sensor 5 and the amplifier 20. In some preferred embodiments of the invention, the magnetic field sensor 5 and amplifer 20 and the feedback that it provides to conductor 13 can be eliminated if the variation of the magnetic bias field with the age of the various components is not significant. However, if aging of components (or other factors) produces an undesirable variation in the magnetic bias field to which the bubble memory chips are exposed, then magnetic field sensor 5 and amplifier circuitry 20 can be provided to sense the magnetic bias field and produce a corrective summing current into conductor 13 in order to correspondingly alter the drive current through Z coil 3 and thereby correct the magnetic bias field to account for such undesirable variations.

Figure 2:
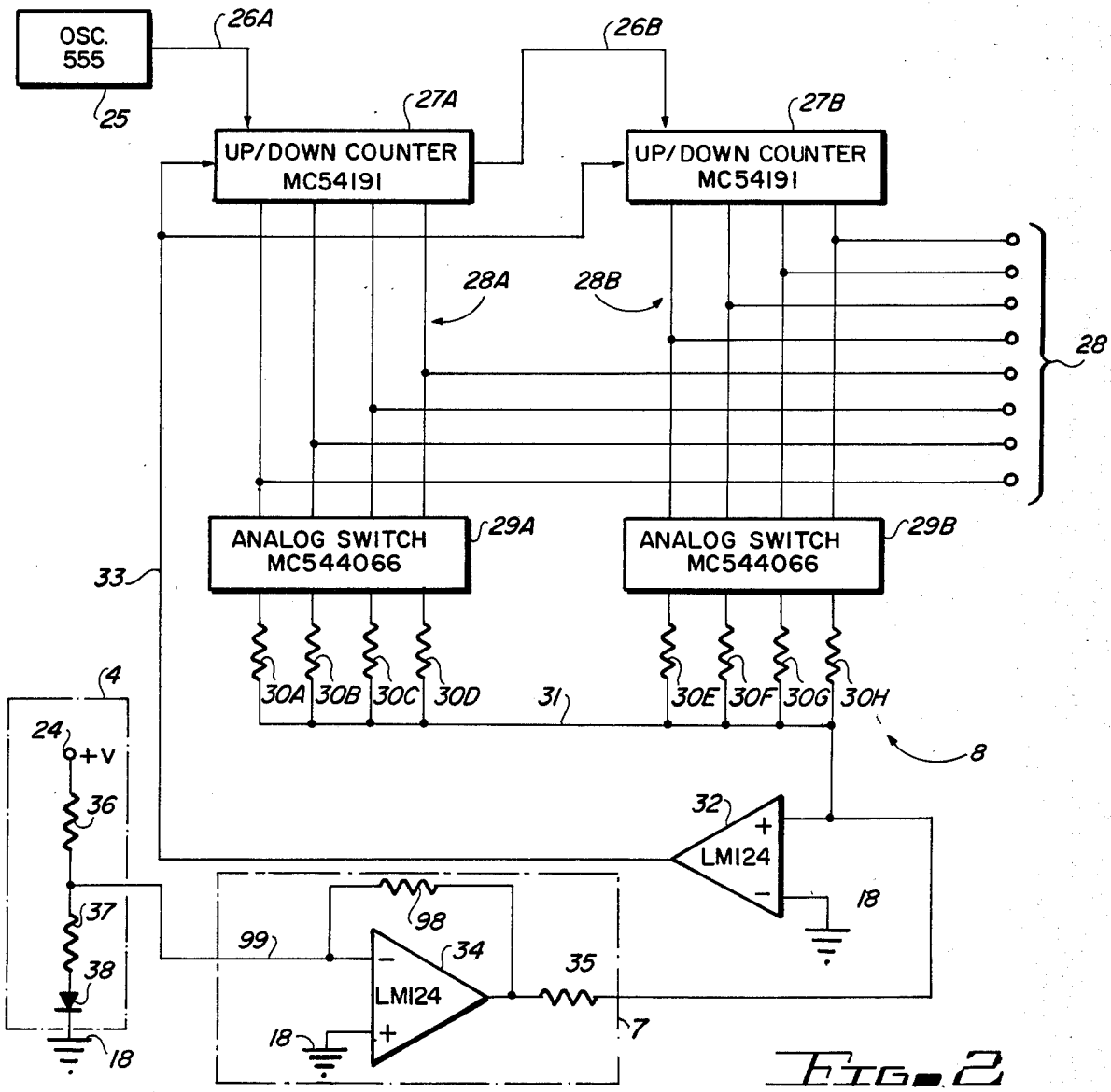
FIG. 2 is a block diagram of a low power analog to digital converter circuit and a temperature sensing circuit which can be utilized in the system of FIG. 1.

The basic components shown in FIG. 1 can be readily implemented by those skilled in the art. The temperature sensor 4 can be a suitable thermistor or can be a temperature sensing diode circuit of the type designated by reference numeral 4 in FIG. 2, subsequently described. The gain circuit 7 can be the operational amplifier 34 connected as shown in FIG. 2, subsequently described. Analog to digital converter 8 can be a CMOS implementation described in detail with reference to FIG. 2. Programmable read only memory 10 can be a fusable link CMOS programmable read only memory such as the Harris HM661, which is a 256 word by eight bit device. Digital to analog converter 12 can be implemented by using circuitry similar to some of that in analog to digital converter shown in FIG. 2. Operational amplifiers 14 and 20 can be National Semiconductor LM124 low power devices, which are readily available. PNP power transistor 15 can be a 2N2532. Magnetic field sensor 5 can be a PN915512-12 Hall effect device sold by Microswitch, Inc.

The above-described system results in the widest possible operating margins for any particular design of the bubble memory system 2. The system automatically compensates for any variation with temperature in all of the components of the bubble memory system, including the bubble memory chip itself, the X coil, the Y coil, and the circuitry that drives the X and Y coils.

Figure 3:
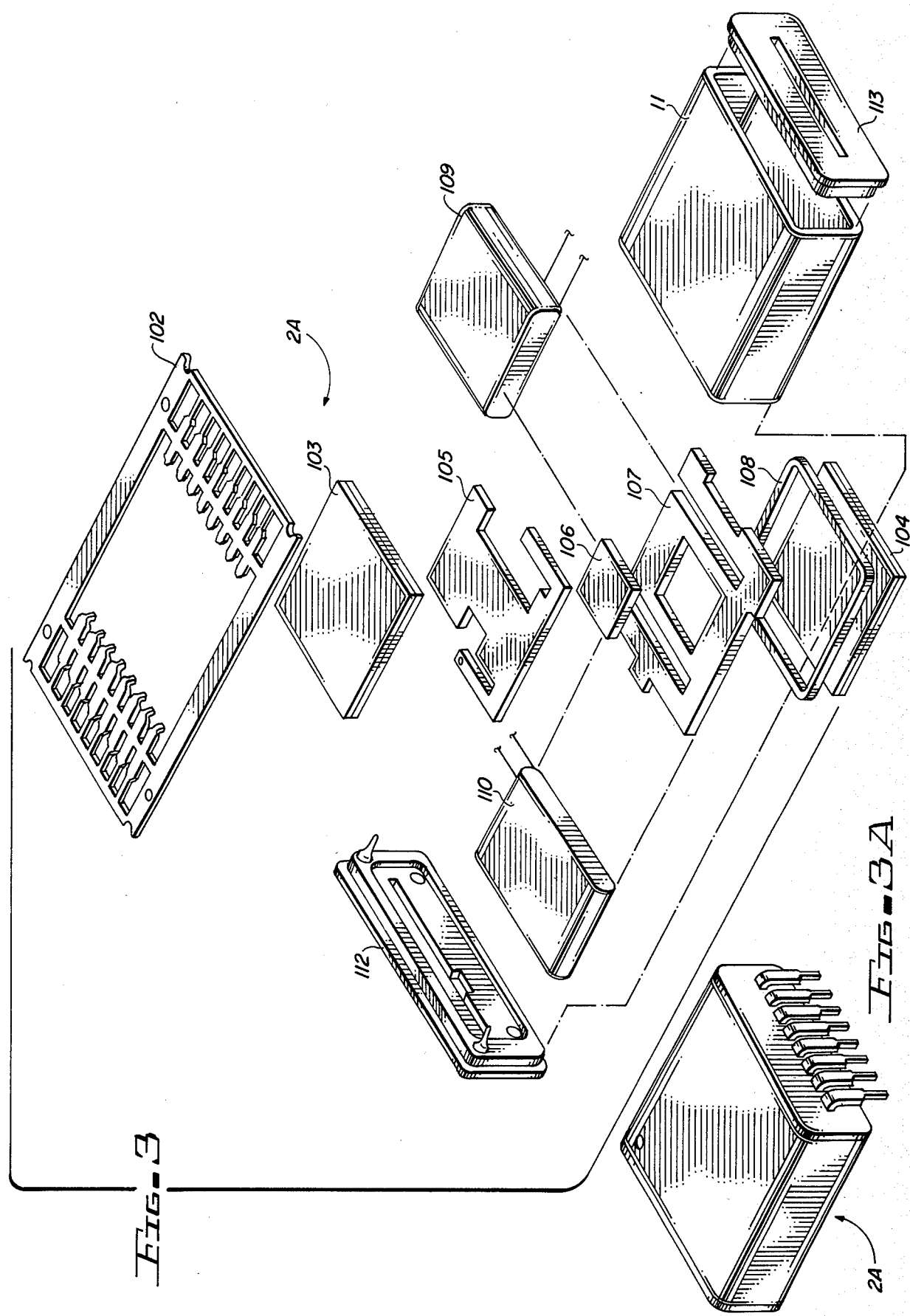
FIG. 3 is an exploded perspective view of a bubble memory device in conjunction with which the temperature compensation circuitry of FIG. 1 can be utilized.

Referring now to FIG. 3, the exploded view of a conventional bubble memory system 2A that can be used to implement bubble memory system 2 of FIG. 1 includes a 16 pin lead frame 102 and bias magnets 103 and 104. A bubble memory chip 106 is "sandwiched" between bias magnets 103 and 104. Chip 106 is held in a chip carrier 107. Chip carrier 107 rests on a Z coil 108. A screen 105 is positioned above bubble memory chip 106 and chip carrier 107, and bias magnet 103 is placed above screen 105. Bubble memory chip 106 and the inner portion of chip carrier 107 are surrounded by Y coil 109, as indicated by dashed lines 1094. X coil 110 surrounds the assembly including bubble memory chip 106, chip carrier 107 and Y coil 109, as indicated by the dashed lines. The electrical contact points of lead frame 102 are electrically bonded in the usual fashion to conductors associated with bubble memory 106. The entire above-described assembly is positioned inside of housing 11, the ends of which are sealed by means of end caps 112 and 113. The complete assembly, after the frame portion of lead frame 102 has been removed and the leads have been bent, is shown in FIG. 3A.

Referring next to FIG. 2, a very low power CMOS implementation of analog to digital converter 8 includes an oscillator 25 set to produce output pulses every millisecond on conductor 26A. Conductor 26A is connected to the clock input of a CMOS up/down counter 27A, which is a four bit counter. Its carry output is connected by means of conductor 26B to the clock input of a second identical four bit up/down counter 27B.

A control conductor 33 is connected to the up/down control input of both of counters 27A and 27B. The four digital outputs 28A of up/down counter 27A are connected to the four inputs of an analog switch circuit 29A. Similarly, the four digital outputs 28B of up/down counter 27B are connected to the four inputs of a four bit analog switch circuit 29B. Reference numeral 28 generally designates the two groups of conductors 28A and 28B, which produce the digital output of analog to digital converter 8. The four outputs of analog switch 29A are coupled by means of resistors 30A, 30B, 30C, and 30D to summing conductor 31. Similarly, the outputs of analog switch circuit 29B are coupled by means of resistors 30E, 30F, 30G, and 30H to summing conductor 31.

Summing conductor 31 is connected to the positive input of operational amplifier 32, the negative input of which is connected to ground conductor 18. The output of amplifier 32 is connected to up/down control conductor 33 in order to control whether up/down counters 27A and 27B are counting up or down in response to the signal produced by oscillator 25.

Summing conductor 31 is coupled by means of resistor 35 to the output of operational amplifier 34.

In FIG. 2, the temperature sensor 4 of FIG. 1 is designated by dotted line 4, and is implemented by means of a diode 38 having its cathode connected to ground conductor 18 and its anode connected to resistor 37. The other terminal of resistor 37 is connected by conductor 99 to the negative input of amplifier 34 and also to one terminal of a resistor 36. The other terminal of resistor 36 is connected to the voltage supply conductor 24. Conductor 99 is coupled by feedlock resistor 98 to the output of operational amplifier 34. The negative input of operational amplifier 34 is connected to ground conductor 18.

The components of analog to digital converter 8 can be easily supplied by one skilled in the art. For example, oscillator 25 can be implemented by means of a CMOS 555 timer, available from various manufacturers. Up/down counters 27A and 27B can be implemented by CMOS integrated circuits manufactured by Motorola, having the part number MC54191. Analog switch circuits 29A and 29B can be each implemented by means of MC544066 CMOS integrated circuits manufactured by Motorola. Operational amplifiers 32 and 34 can be LM124 low power operational amplifiers produced by National Semiconductor Corporation. Resistors 30A through 30H can have the values of 10 kilohms, 20 kilohms, 40 kilohms, 80 kilohms, 160 kilohms, 320 kilohms, 640 kilohms, and 1.28 megohms, respectively, to accomplish the desired low power operation at an adequate speed.

Those skilled in the art will easily recognize that the low power analog to digital converter 8 operates generally in the following fashion. Oscillator 25 continually produces a relatively slow clocking signal causing up/down counter 27A to count either up or down, depending on the state of conductor 33. The two four-bit counters 27A and 27B are connected to operate as a single eight-bit up/down counter. The outputs of the up/down counters 27A and 27B continue to switch the upper terminals of the resistors 30A to 30H to various particular positive voltage supplied inside the analog switch circuits 29A and 29B developing this voltage across various ones of the resistors, since summing current node 31 is held at a virtual ground by operational amplifer 32. When the summing current produced by resistors 30A through 30H equals the current being drawn out of summing node conductor 31 by operational amplifier 34 in response to the temperature sensing diode 38, the voltage level on conductor 33 is changed, changing the direction of counting of the up/down counters 27A and 27B. From then on, the least significant bit of the digital output conductors 28 will vary with each count of oscillator 25, about the value which represents the appropriate amount of magnetic bias field compensation needed to be produced by Z coil 3 at the present temperature.

Digital to analog converter 12 of FIG. 1 can be implemented by using part of circuitry of analog to digital converter of FIG. 2, as follows. The digital input conductors 11 (FIG. 1) on which the temperature compensation data from programmable read only memory 10 are produced are applied to the eight digital inputs of analog switch circuits such as 29A and 29B. They produce a summing current on conductor such as 31, which can be connected to conductor 13 in FIG. 1 and an appropriate resistance in order to generate an analog signal that corresponds to the digital temperature compensation data word selected from programmable read only memory 10, to thereby determine the appropriate amount of adjustment of the drive current to be applied by transistor 15 to Z coil 3.

Other commercially available analog to digital converters and digital to analog converters than the ones described above can be used, but they may not have as low power dissipation as the analog to digital converters described above.

Figure 4:
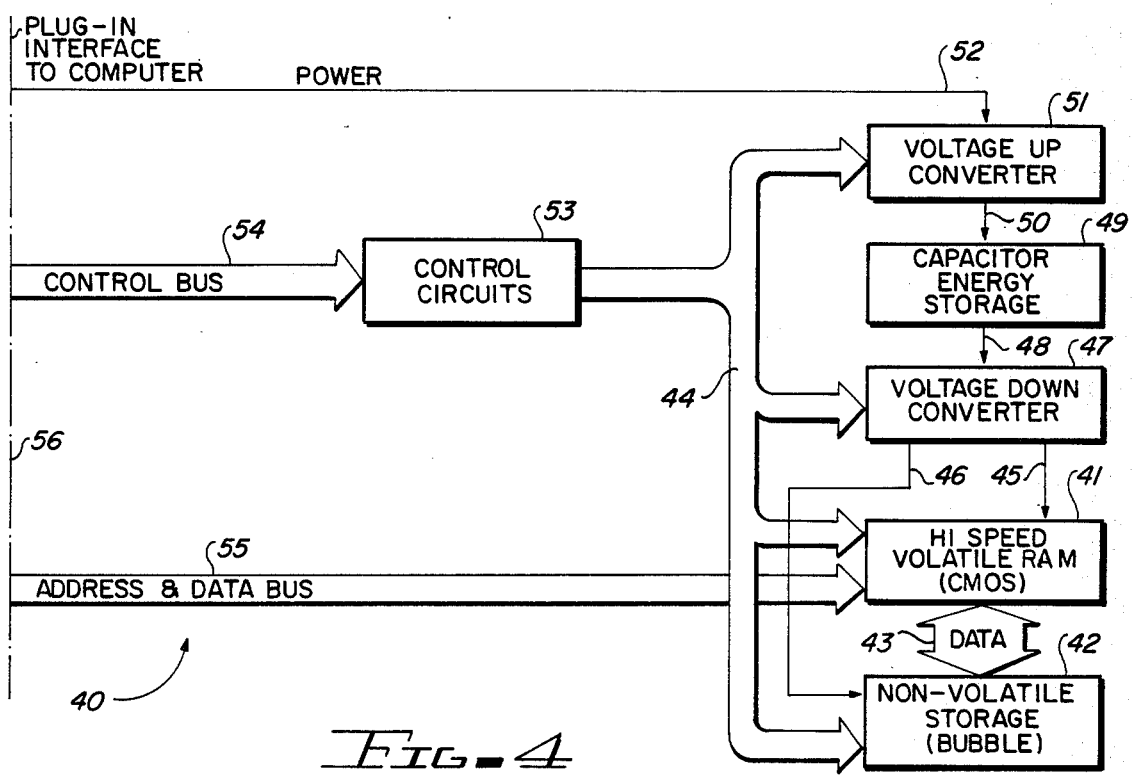
FIG. 4 is a block diagram of a hybrid high speed semiconductor random access memory, with a non-volatile bubble memory back-up system that can be utilized as a core memory replacement which is non-volatile.

It is to be emphasized that low overall power dissipation of the circuit shown in FIG. 1 is very important, because it is necessary to have minimum size back up storage capacitors 49 to supply the power during transferring of data from the high speed CMOS memory 41 of FIG. 4 to the bubble memory storage system 2 of FIG. 1 during a power interruption of the main operating power system.

Next, a non-volatile high speed semiconductor random access memory system will be described with reference to FIG. 4, wherein hybrid memory 40 includes a "back-up" bubble memory designated by reference numeral 42. Reference numeral 43 designates the bi-directional data bus coupling CMOS RAM (Random Access Memory) 41 to bubble memory 42. As will be subsequently described in more detail, normally the computer carries on its operations by accessing CMOS 41 as its mainframe memory. However, since CMOS 41 is volatile, whenever there is a power failure the hybrid memory 40 rapidly transfers the entire contents of CMOS 41 to non-volatile bubble memory 42. A bank of energy storage capacitors 49 supplies enough energy to maintain the voltage supply lines of CMOS memory 41, bubble memory 42, and the other circuitry shown in FIG. 4 within a predetermined voltage range long enough to allow this transfer of data to be accomplished. Conductor 45 supplies the necessary five volts to CMOS memory 41. Conductor 46 supplies the necessary operating voltage to bubble memory 42. The voltages on conductors 45 and 46 normally receive their operating power from the main power bus 52.

However, during a power failure in which the power on main power bus 52 is interrupted, the voltage and energy stored on the capacitors in capacitor bank 49 is coupled by means of conductor 48 to voltage down converter circuit 47. Voltage down converter cirucit 47 maintains the proper operating voltages on conductors 45 and 46 to permit complete transfer of data in CMOS RAM 41 to bubble memory 42.

The energy stored on the capacitors in capacitor bank 49 necessarily is initially at a very high voltage, typically approximately 100 volts. As the data transfer from CMOS RAM 41 to bubble memory 42 progresses, the voltage across the capacitors 49 "falls off". Voltage down converter circuit 47, subsequently described in detail with reference to FIG. 5, accomplishes the conversion of this decreasing voltage on conductor 48 to the precise, regulated operating voltage or voltages needed on conductors 45 and 46.

Control signals from control bus 44 perform the necessary logic and gating functions needed to regulate and apply the voltage on main power bus 52 to conductors 45 and 46 during normal operation. However, in the event of an interruption of the main power on bus 52, conductors 45 and 46 are operatively connected to circuitry in voltage down converter circuit 47 so that the high but decreasing voltage level on conductor 48 is converted to the precise regulated operating voltages on conductors 45 and 46.

Figure 5:
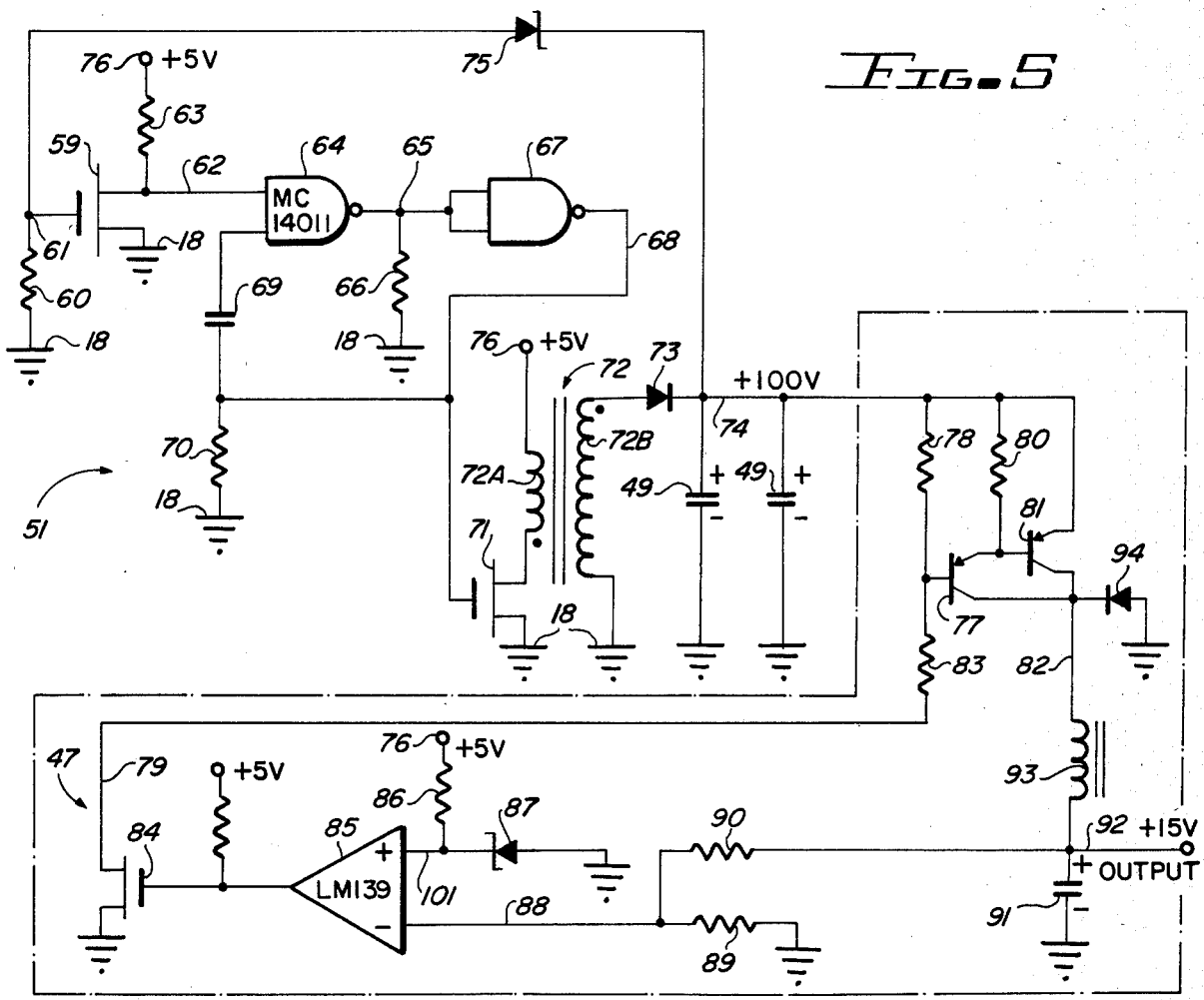
FIG. 5 is a diagram of the voltage up converter circuit of FIG. 4 and the voltage down circuit of FIG. 4.

A "voltage up" converter circuit 51 boosts the normal operating voltage on main power bus 52 to produce the 100 volts needed to charge up capacitor bank 49 and thereby store enough energy in case of a power failure. The details of voltage up converter circuit 51 are shown in FIG. 5.

Control circuitry 53 receives control inputs such as control and address inputs from the computer and generates the necessary signals on bus 44 to effectuate proper operation of voltage up converter circuit 51 during normal memory operation, and to also effectuate proper operation of voltage down converter circuit 47 to achieve the desired data transfer between CMOS RAM 41 and bubble memory 42 during a power interruption.

After power is restored following an interruption which results in transfer of data from CMOS RAM 41 to bubble memory 42, the control circuitry 53 automatically generates the necessary address and control signals on bus 44 to reload all of the data in bubble memory 42 back into its original locations in CMOS RAM 41 so that the computer can continue its operation.

Thus, the CMOS-bubble hybrid memory module 40 has essentially the same "black box" characteristics as a core memory having the same organization and data storage capacity.

The details of voltage up converter 51 of FIG. 4 and the details of voltage down converter circuit 47 of FIG. 4 are shown in FIG. 5.

Referring to FIG. 5, voltage up converter circuit 51 includes an MOS field effect transistor 59 (which can be a Siliconix VN2222L) having its source connected to ground conductor 18 and its drain connected by means of conductor 62 to one input of a two input NAND gate 64 and to one terminal of a resistor 63, the other terminal of which is connected to voltage supply conductor 76. The gate electrode of field effect transistor 59 is connected by means of conductor 61 to one terminal of resistor 60, the other terminal of which is connected to ground. Conductor 61 also is connected to the anode of a 100 volt Zener diode 75, the cathode of which is connected to conductor 74. Conductor 74 is also connected to one terminal of the capacitors 49 of the capacitor bank (which is also designated by reference numeral 49 in FIG. 4). The other terminals of capacitors 49 are connected to ground conductor 18. Thus, voltage up converter 51 charges capacitors 49 up to approximately +100 volts.

The output of NAND gate 64 is coupled by means of conductor 65 to both inputs of a two input NAND gate 67, which is connected to function as an inverter. Gates 64 and 67 can be implemented by Motorola MC14011 CMOS integrated circuits. The output of inverter 67 is connected by means of conductor 68 to the gate electrode of a MOS field effect transistor 71 and to one electrode of a capacitor 69. The other electrode of capacitor 69 is connected back to the other input of NAND gate 64 and also to one terminal of resistor 70, the other terminal of which is connected to ground conductor 18. Capacitor 69 can have a capacitance of 100 picofarads.

Field effect transistor 71 can be a Siliconix 2N6658. The source electrode of field effect transistor 71 is connected to ground conductor 18, and the drain electrode is connected to the "dotted" terminal of primary winding 72A of a transformer 72. The "undotted" terminal of primary winding 72A is connected to the +5 volt power supply conductor 76. The "undotted" terminal of secondary winding 72B of transformer 72 is connected to ground, and its "dotted" terminal is connected to the anode of diode 73, the cathode of which is connected to conductor 74.

Still referring to FIG. 5, voltage down converter circuit 47 receives as its input the initial +100 volts stored on energy storage capacitors 49 and applies it to the emitter of a PNP transistor 81, which can be an RCA 2N6212. The base of transistor 81 is coupled by resistor 80 to conductor 74 and also to the emitter of a second PNP transistor 77, which can be an RCA 2N5415. The base of transistor 77 is coupled by resistor 78 to conductor 74 and also by means of resistor 83 to conductor 79. The collectors of both transistors 77 and 81 are connected to conductor 82.

Conductor 79 is connected to the drain of MOS field effect transistor 84, which has its source connected to ground conductor 18. Field effect transistor 84 can be a Siliconix VN2410M. The gate electrode of field effect transistor 84 is connected to the output of an LM139 comparator 85. The negative input of amplifier 85 is connected to conductor 88, which is coupled by means of resistor 89 to ground conductor 18 and by means of resistor 90 to conductor 92, on which a regulated +15 volt output voltage is produced as a result of energy drained off of capacitors 49 during a power failure that necessitates transfer of data from CMOS memory 41 to bubble memory 42.

The positive input of comparator 85 is connected by conductor 101 to the cathode of Zener diode 87 which can be an LM113 by National Semiconductor. The anode of Zener diode 87 is connected to ground. The positive input of amplifier 85 is also coupled by resistor 86 to the +5 volt power supply.

Conductor 92 is coupled to one terminal of capacitor 91, which can have a value of 100 microfarads. The other terminal of capacitor 91 is connected to ground. Conductor 92 is also connected to inductor 93, which can be a non-saturing core inductor having an inductance of 100 microhenries. The other terminal of inductor 93 is connected to conductor 82 and to the cathode of diode 94. The anode of diode 94 is connected to ground.

The operation of the voltage up converter circuit 51 of FIG. 5A is relatively simple. NAND gate 64 and inverter 67 are connected as a ring counter that continuously oscillates as long as a high level is present on conductor 62, which functions as an enable circuit for the ring oscillator. The output of inverter 67, produced on conductor 68, turns field effect transistor 71 abruptly on and off, causing transformer 72, which has a turns ratio of apprximately 1:2, to produce an amplified signal at the "dotted" output of winding 72B. This amplified signal is rectified by diode 73 and charges up capacitors 49. When the voltage on conductor 74 exceeds 100 volts, 100 volt avalanche diode 75 breaks down in the reverse direction. Further increases in the voltage on conductor 74 raise the voltage on conductor 61, turning on field effect transistor 59, pulling down the voltage on conductor 62 and thereby disabling the ring oscillator. Operation of the circuitry continues in this fashion as necessary to maintain approximately 100 volts on conductor 74.

The operation of down converter circuit 47 also is relatively straight-forward. PNP transistors 77 and 81 act as a valve that supplies the voltage on capacitors 49 to output conductor 92 through inductor 93. Inductor 93 performs a filtering function. The voltage on conductor 92, which is actually the output voltage produced on one or both of conductors 45 and 46 of FIG. 4, is divided by the ratio of resistors 89 and 90 to produce a control signal that is applied to the negative input of amplifier 85. The other input of amplifier 85 is connected to a reference voltage which is the reverse breakdown voltage of Zener diode 87. An exemplary value of resistor 90 is seven kilohms and a exemplary value of resistor 90 is one kilohm. When the voltage on conductor 88, the junction between resistors 89 and 90, exceeds the breakdown voltage of Zener diode 87, a low level is produced on the gate input of field effect transistor 84. Field effect transistor 84 is thereby maintained in a sufficiently "on" condition to cause PNP transistors 77 and 81 to precisely maintain a regulated output voltage on conductor 92. This regulated output voltage is equal to the breakdown voltage of Zener diode 87, scaled up by the ratio of resistors 89 and 90. Capacitor 91 performs the function of filtering the regulated output voltage on conductor 92. Diode 94 is a conventional 2N5802 used here in a fly back configuration. It allows the energy stored in inductor 93 to "dump" into capacitor 91 when transistor 81 turns off.

The above-described Hybrid CMOS/bubble memory system with its novel bias field correction system makes possible a very efficient design of the CMOS control circuitry 53 and the control circuitry associated with the non-volatile bubble memory system 42, so that a capacitor bank 49 having a relatively small physical size can be utilized to supply enough power to effectuate a complete transfer of the entire contents of CMOS RAM 41 to bubble memory system 42 in the event of a power interruption, thereby making the entire memory system non-volatile, in effect. It is believed that the above design can be implemented with a total capacitor bank capacitance of approximately 10,000 microfarads for a one million bit CMOS RAM. The entire one million bit memory system can be packaged in a module having the same dimensions as a typical one million bit core memory module, i.e., six inches high by nine inches wide by 1.4 inches deep. The high speed, low power CMOS memory is capable of faster operation that the core memory module that it replaces, and can be used as a plug-in replacement for that module.

While the invention has been described with reference to a particular embodiment thereof, those skilled in the art will be able to make various modifications to the described embodiment of the invention without departing from the true spirit and scope thereof. It is intended that all variations in the described apparatus and method that perform substantially the same work in substantially the same way to achieve substantially the same result are encompassed within the scope of the invention.

I claim:

1. A method of operating a bubble memory system, said method comprising the steps of:
   (a) subjecting said bubble memory system to a plurality of different temperatures and, at each of said temperatures, changing a magnetic bias field influencing a bubble memory chip of said bubble memory system to a value that optimizes operation of said bubble memory system in a predetermined manner;
   (b) storing digital temperature compensation data numbers representative of the amount of said change of said magnetic bias field at each of said temperatures in individually addressable locations of a memory, respectively;
   (c) sensing a temperature indicative of the present temperature of said bubble memory chip during operation of said bubble memory system to produce a first analog signal;
   (d) converting said first analog signal to a first digital number representative of the present temperature of said bubble memory chip;
   (e) accessing said memory in response to said first digital number to obtain a first one of said temperature compensation data numbers;
   (f) converting said first temperature compensation number to an analog output signal representative of the amount of correction needed in said magnetic bias field at said present temperature; and
   (g) changing said magnetic bias field by a predetermined amount corresponding to the level of said analog output signal.

2. The method of claim 1 wherein step (f) includes writing said digital data numbers into separately addressable locations of a programmable read only memory.

3. The method of claim 1 wherein step (d) includes using a CMOS analog to digital converter to produce said first digital number.

4. The method of claim 3 wherein step (f) includes using a CMOS digital to analog converter to produce said analog output signal.

5. The method of claim 4 wherein step (g) includes varying the current through a Z coil that alters said magnetic bias field, in response to said analog output signal.

6. The method of claim 1 including using a magnetic sensor to sense the strength of said magnetic bias field to produce a second analog signal and further adjusting the value of said analog output signal in response to said second analog signal.

7. A system for temperature compensating a bubble memory system, said bubble memory system including a bubble memory chip, said system comprising:
   (a) memory means for storing digital temperature compensation data numbers representative of an amount of change of a magnetic bias field influencing said bubble memory chip at each of a plurality of temperatures in individually addressable locations of said memory means, each of said temperature compensation data numbers representing an amount of change in said magnetic bias field needed to optimize operation of said bubble memory system at a respective one of said temperatures in a predetermined manner;
   (b) means for sensing a temperature indicative of the present temperature of said bubble memory chip during operation of said bubble memory system to produce a first analog signal;
   (c) means for converting said first analog signal to a first digital number representative of the present temperature of said bubble memory chip;
   (d) means for effectuating accessing of said memory means in response to said first digital number to obtain a first one of said temperature compensation data numbers;
   (e) means for converting said first temperature compensation number to a second analog signal representative of the amount of correction needed in said magnetic bias field at said present temperature; and
   (f) means for changing said magnetic field by a predetermined amount in response to said second analog signal.

8. The system of claim 7 wherein said memory means includes a programmable read only memory.

9. The system of claim 8 wherein said first analog signal converting means includes an analog to digital converter for converting said first analog signal to said first digital number, and means for applying said first digtal number to address inputs of said programmable read only memory.

10. The system of claim 9 wherein said first temperature compensation number means includes a digital to analog converter for producing said second analog signal, and means coupled to data outputs of said programmable memory for coupling said first temperature compensation number to the digital inputs of said digital to analog converter.

11. The system of claim 10 wherein said magnetic field changing means includes a Z coil influencing a Z magnetic field to which said bubble memory chip is subjected and current driving means responsive to said second analog signal for producing a current in said Z coil which produces a predetermined adjustment in said Z magentic field.

* * * * *